(12) United States Patent
Ogita

(10) Patent No.: US 6,576,288 B2
(45) Date of Patent: Jun. 10, 2003

(54) RESIN FILM FORMING METHOD AND RESIN FILM FORMING APPARATUS EMPLOYING SAID METHOD

(75) Inventor: Katsuya Ogita, Fussa (JP)

(73) Assignees: Casio Computer Co., Ltd., Tokyo (JP); Casio Micronics Co., Ltd., Tokyo (JP)

( * ) Notice: Subject to any disclaimer, the term of this patent is extended or adjusted under 35 U.S.C. 154(b) by 224 days.

(21) Appl. No.: 09/736,797

(22) Filed: Dec. 14, 2000

(65) Prior Publication Data

US 2001/0004916 A1 Jun. 28, 2001

(30) Foreign Application Priority Data

Dec. 28, 1999 (JP) .......................... 11-372193
Jan. 13, 2000 (JP) ........................ 2000-004343

(51) Int. Cl.⁷ ............................ B05D 5/12; B05D 1/40; B05D 1/02; B05B 7/00; H01L 21/44
(52) U.S. Cl. ..................... 427/96; 427/207.1; 427/331; 427/372.2; 427/424; 156/246; 118/314; 118/315; 264/272.14; 29/855; 438/127
(58) Field of Search ................. 438/126, 127; 29/841, 855, 856; 118/313, 314, 315, 663; 156/64, 244.12, 246; 264/272.11, 272.12, 272.13, 272.14, 272.17; 427/96, 207.1, 331, 372.2, 424

(56) References Cited

U.S. PATENT DOCUMENTS 5,795,390 A * 8/1998 Cavallaro ................... 118/314

FOREIGN PATENT DOCUMENTS

| JP | 06-252239 | * | 9/1994 | ............ H01L/21/68 |
| JP | 08-017854 | * | 1/1996 | ............ H01L/21/56 |
| JP | 11-297726 | * | 10/1999 | ............ H01L/23/28 |

* cited by examiner

Primary Examiner—Jerry A. Lorengo
(74) Attorney, Agent, or Firm—Frishauf, Holtz, Goodman & Chick, P.C.

(57) ABSTRACT

Where the length LD of a resin film forming region is, for example, 3 times as long as the pitch of the sprocket holes of the base film, the resin coating is performed by using 6 nozzles, and where the length LD is, for example, 6 times as long as the pitch of the sprocket holes, the resin coating is performed by using 3 nozzles. As a result, the transfer distance of the base film transferred in a single resin coating process is 18 times as long as the pitch of the sprocket holes. It follows that it is possible to set constant the time for the base film to pass through the drying section even if the length LD of the resin film forming region differs.

12 Claims, 8 Drawing Sheets

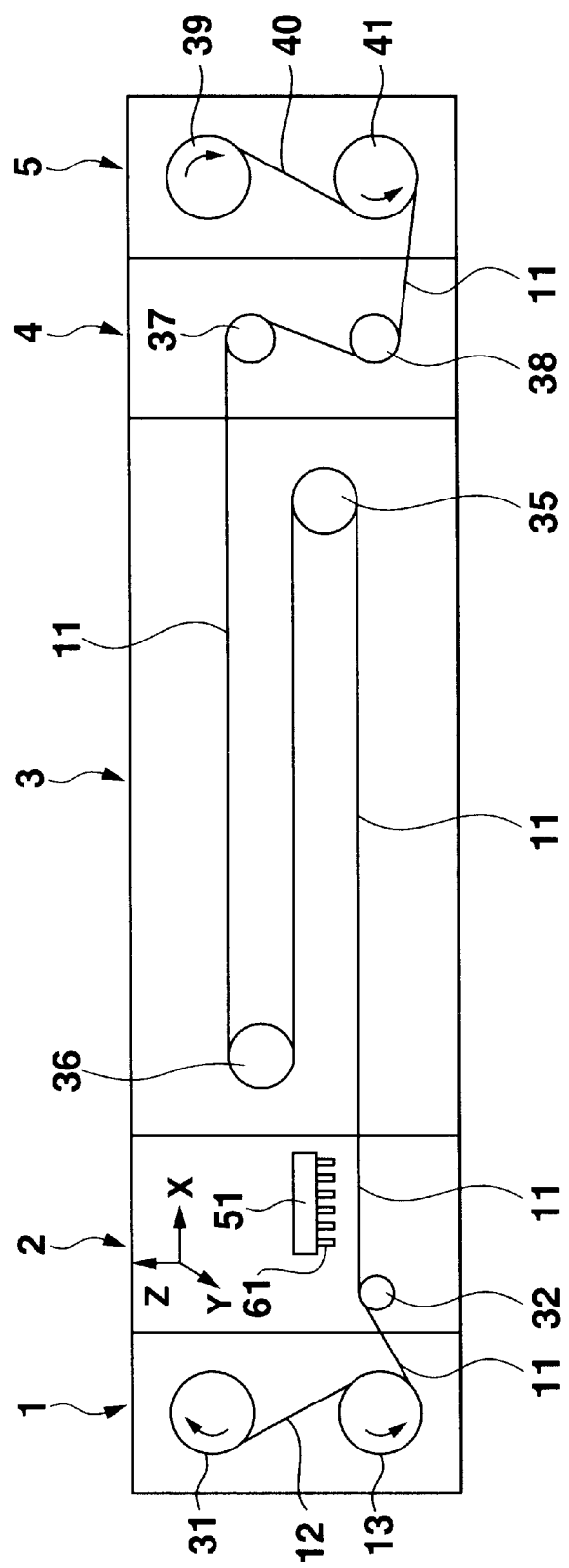

FIG.5

| | | | | | | | | | | THE NUMBER OF ARRANGED NOZZLES |
|---|---|---|---|---|---|---|---|---|---|---|
| ARRANGING POSITION OF NOZZLES | 1 | 0 | ○ | ○ | ○ | ○ | ○ | ○ | ○ | ○ | ○ |
| | | 1 | | | | | | | | | |
| | 2 | 2 | ○ | | | | | | | | 8 |
| | 3 | 3 | | ○ | | | | | | | 6 |
| | 4 | 4 | ○ | | ○ | | | | | | 5 |
| | 5 | 5 | | | | ○ | | | | | 4 |
| | 6 | 6 | ○ | ○ | | | ○ | | | | 3 |
| | 7 | 7 | | | | | | ○ | | | 3 |
| | 8 | 8 | ○ | | ○ | | | ○ | | | 2 |
| | 9 | 9 | | ○ | | | | | ○ | | 2 |
| | 10 | 10 | ○ | | | ○ | | | | ○ | 2 |
| | 11 | 11 | | | | | | | | | |
| | 11 | 12 | ○ | ○ | ○ | | ○ | | | | |
| | | 13 | | | | | | | | | |
| | 12 | 14 | ○ | | | | ○ | | | | |
| | 13 | 15 | | ○ | | ○ | | | | | |
| | 14 | 16 | | | ○ | | | | | | |
| LENGTH $L_D$ OF DEVICE REGION (PITCHES) | | | 2 | 3 | 4 | 5 | 6 | 7 | 8 | 9 | 10 |

RESIN FILM FORMING METHOD AND RESIN FILM FORMING APPARATUS EMPLOYING SAID METHOD

CROSS-REFERENCE TO RELATED APPLICATIONS

This application is based upon and claims the benefit of priority from the prior Japanese Patent Applications No. 11-372193, filed Dec. 28, 1999; and No. 2000-004343, filed Jan. 13, 2000, the entire contents of which are incorporated herein by reference.

BACKGROUND OF THE INVENTION

The present invention relates to a resin film forming method and a resin film forming apparatus employing said method, particularly, to a method and apparatus for simultaneously forming resin films in a plurality of resin film forming regions arranged on one surface of a film.

In, for example, a TAB (Tape Automated Bonding) system, which is one of mounting technologies of a semiconductor chip such as an IC or an LSI, a long base film is transferred by the so-called roll-to-roll method so as to coat semiconductor chips arranged at a predetermined interval in the longitudinal direction of the base film with resin, thereby forming a sealing resin film.

FIG. 6 schematically shows, as an example, the construction of a conventional resin film forming apparatus used in the TAB system. As shown in the drawing, the conventional resin film forming apparatus comprises a base film supply section 1, a resin coating section 2, a drying section 3, a tension imparting section 4 and a base film take-up section 5 as viewed from the left side toward the right side. In this case, a laminate structure consisting of a long base film 11 and a protective spacer 12 is rolled about a reel 13 as shown in FIG. 7, and the resultant roll is arranged in the base film supply section 1.

The base film 11 is constructed as shown in, for example, FIG. 8. To be more specific, sprocket holes 21 are arranged at a pitch P on both sides in the width direction of the base film 11. A device hole 23 and an outer lead hole 24 are formed in each device region 22 of the base film 11. Also, a large number of input wirings 25 and a large number of output wirings 26 are formed in each device region 22 on the lower surface of the base film 11. Further, a semiconductor chip 27 is mounted on the base film 11 by coupling wirings 25 and 26 within each device hole 23.

If the base film 11 and the spacer 12 are released from the reel 13 in the base film supply section 1, the spacer 12, which is obstructive to the resin coating, is wound about a spacer reel 31 so as to be recovered. On the other hand, the base film 11 released from the reel 13 is supplied into the resin coating section 2 through a guide roller 32.

Two nozzles 33 and 34 are arranged within the resin coating section 2. These two nozzles 33, 34 are moved in X, Y and Z directions by an XYZ robot (not shown), and that portion of the base film 11 in which two adjacent semiconductor chips 27 are mounted is coated with resin so as to form a resin film (not shown). The two nozzles 33 and 34 are used for improving the efficiency of the resin coating operation.

Then, the base film 11 is transferred into the drying section 3. In the drying section 3, the base film 11 passes through first and second guide rollers 35 and 36, and the resin film coated in the resin coating section 2 is dried by a heater (not shown). The base film 11 further passes through two tension imparting rollers 37 and 38 arranged within the tension imparting section 4 so as to be transferred into the base film take-up section 5. In the base film take-up section 5, the base film 11 is superposed with another spacer 40 released from another spacer reel 39 and the resultant superposed structure is wound up about another reel 41.

It should be noted that the pitch P of the sprocket holes 21 of the base film 11 is defined to be, for example, 4.75 mm in JIS (Japanese Industrial Standards), and the design and manufacture are performed on the basis of the sprocket holes 21 thus defined. In the case of FIG. 8, a single device region 22 corresponds to 6 sprocket holes 21. The length of the base film 11 corresponding to the device region 22, hereinafter referred to as a length LD of the device region 22, is called a 6-pitch length. Also, where the base film 11 is transferred over a distance corresponding to the 6 sprocket holes 21, it is stated that the base film 11 is transferred by 6 pitches.

In the resin coating section 2, the base film 11 is intermittently transferred, and the base film 11 is coated with resin by using the nozzles 33 and 34 while the transfer of the base film 11 is stopped. In this case, the time required for a single resin coating step is equal to the sum of the resin coating time and the base film transfer time. However, the base film transfer time is very short, compared with the resin coating time. If the base film transfer time is neglected, the time required for a single resin coating step is determined by the resin coating time. Suppose the resin coating time is m seconds. It should be noted in this connection that, in the resin coating section 2, the mounting portions of two semiconductor chips 27 are simultaneously coated with the resin in a single resin coating step. It follows that the base film 11 is transferred by 12 pitches in m seconds.

On the other hand, it is necessary for the base film 11 to be transferred through the drying section 3 over a time required for drying sufficiently the coated resin film. Suppose M minutes are required for sufficiently drying the coated resin film. In this case, the base film 11 transferred by 12 pitches in m seconds within the resin coating section 2 passes through the drying section 3 over M minutes. If the base film 11 is transferred by 6 pitches in m seconds, the time required for the base film 11 to pass through the drying section 3 is 2M minutes, i.e., twice M minutes noted above.

The length LD of the device region 22 is not limited to 6 pitch length. For example, it is possible for the length LD to be 3 pitch length. Even in the case of the 3 pitch length, the resin coating time of m seconds is required for stopping the transfer of the base film 11 and coating the base film 11 with resin by using the nozzles 33 and 34. Therefore, where the length LD of the device region 22 is equal to the 3 pitch length, the transfer speed of the base film 11 within the resin coating section 2 is set such that the base film 11 is transferred by 6 pitches in m seconds in a single resin coating step. In other words, the transfer distance of the base film 11 transferred in a single resin coating step is half the transfer distance in the case where the length LD of the device region 22 is equal to the 6 pitch length. As a result, the base film 11 passes through the drying section 3 over 2M minutes.

As described above, in the conventional resin film forming apparatus, the time for the base film 11 to pass through the drying section 3 widely differs, if the length LD of the device region 22 differs. In the example described above, the time for the base film 11 to pass through the drying section is M minutes in the case where the length LD of the device region 22 is equal to the 6 pitch length. However, where the length LD of the device 22 is equal to the 3 pitch length, i.e., half the value noted above, the time for the base film 11 to pass through the drying section is 2M minutes. It should be noted that the coated resin film can be dried sufficiently in M minutes. It follows that, where the length LD of the device region 22 is equal to the 3 pitch length, the base film 11 is caused to take a considerably long time for passing through the drying section, leading to a low productivity. Also, it is conceivable in this case to increase the number of XYZ robots used as the resin coating devices. However, the XYZ robot is costly. In addition, it is necessary to set with a high accuracy the positions of the nozzles mounted to each XYZ robot. Such being the situation, it is substantially impossible to increase the number of XYZ robots in the system in which nozzles are mounted to each of the XYZ robots set at different positions under different conditions. Alternatively, it takes a very long time and, thus, is highly inefficient to increase the number of XYZ robots mounted to the resin film forming apparatus.

BRIEF SUMMARY OF THE INVENTION

An object of the present invention is to provide a resin film forming method, which permits maintaining an optimum productivity in conformity with the length of the device region, with the time for a base film to pass though a drying section being set substantially constant even if the length of the device region differs, and a resin film forming apparatus to which the particular method of the present invention can be applied.

According to a first aspect of the present invention, there is provided a resin film forming method, comprising the steps of transferring a long film having resin film forming regions arranged at a pitch LD; simultaneously forming resin films in the k-number of resin film forming regions arranged on one surface of the film by using the k-number of nozzles arranged at a predetermined interval on a path through which the film is transferred; and transferring the film by a predetermined distance for the drying treatment; wherein the number k of nozzles is changed to permit the drying time to fall within a predetermined period in accordance with the length LD of the each of the resin film forming regions arranged on the one surface of the film.

According to a second aspect of the present invention, there is provided a resin film forming apparatus, comprising transfer means for transferring a long film having resin film forming regions arranged on one surface thereof at a pitch LD; a resin film forming mechanism including a plurality of nozzles arranged apart from each other on the path through which the film is transferred, and a nozzle holder to which q-number of the nozzles can be mounted and k-number of nozzles are selectively mounted in accordance with the length LD of the resin film forming region, resin films being formed simultaneously in k-number of resin film forming regions among the resin film forming regions arranged on the one surface of the film; and drying means for drying the film having the resin films formed thereon; wherein transfer distance of the film transferred after formation of the resin films can be set substantially constant by increasing or decreasing the number k of nozzles mounted to the nozzle holder in inverse proportion to the length LD of the resin film forming region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 schematically exemplifies the construction of a resin film forming apparatus according to one embodiment of the present invention;

FIG. 5 is a table for explaining the positions and the numbers of nozzles mounted to the nozzle holder shown in FIG. 2A and for explaining the relationship between the length LD of the device region and the arranging position of the nozzle;

DETAILED DESCRIPTION OF THE INVENTION

Figure 6:
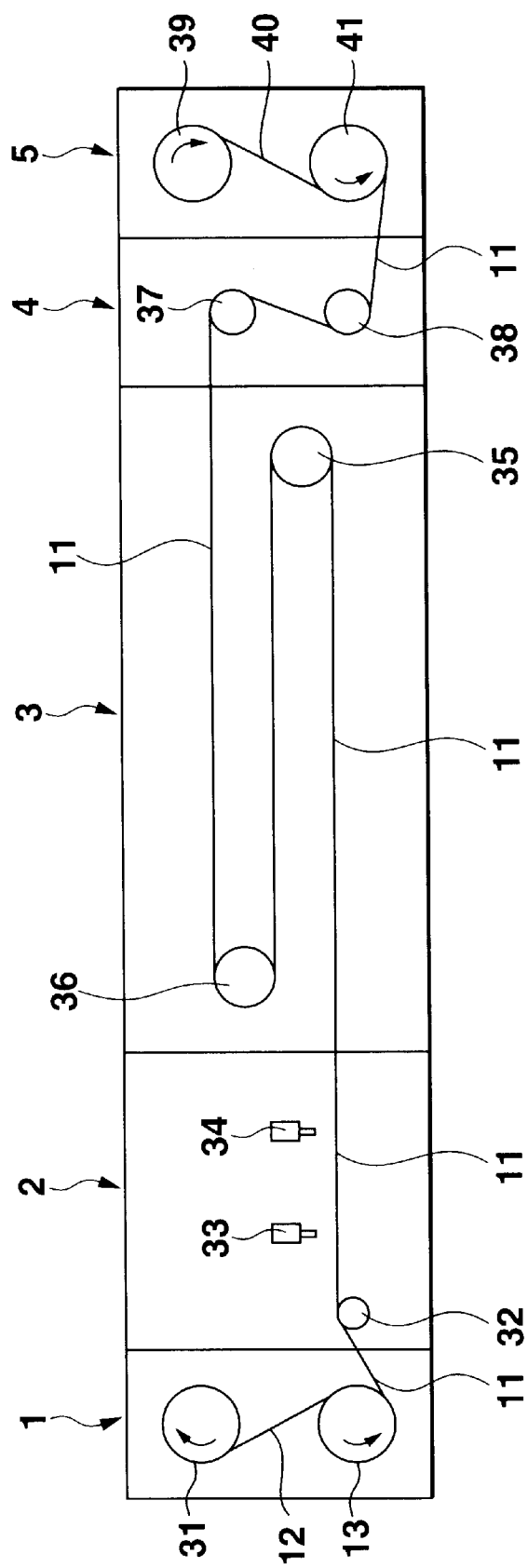
FIG. 6 schematically shows the construction of a conventional resin film forming apparatus.
Figure 7:
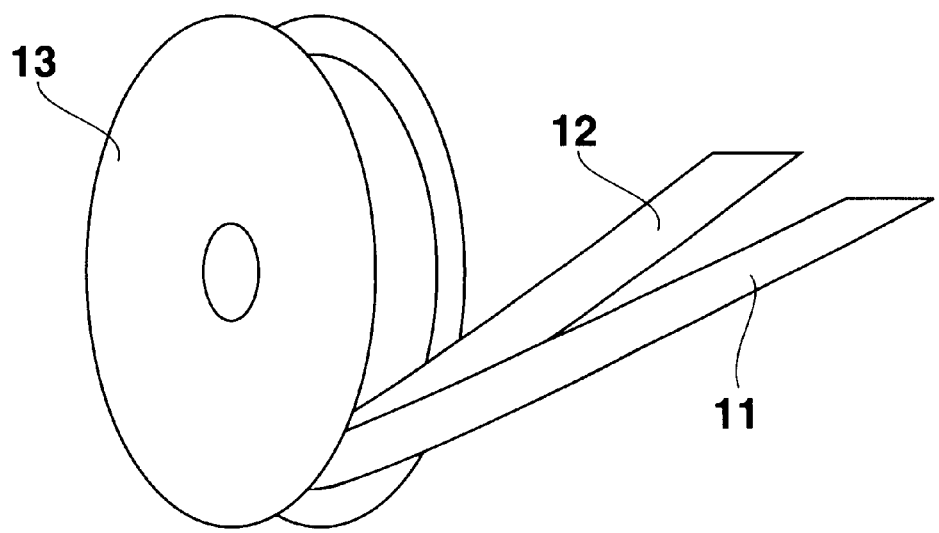
FIG. 7 is an oblique view exemplifying a film used in the film forming apparatus shown in FIG. 6.

FIG. 1 schematically shows a construction of a resin film forming apparatus according to one embodiment of the present invention. In the drawing, the members of the apparatus equal to those shown in FIG. 6 are denoted by the same reference numerals so as to avoid appropriately an overlapping description. The apparatus shown in FIG. 1 widely differs from the conventional apparatus shown in FIG. 6 in that a plurality of nozzles 61 are mounted to a single nozzle holder 51. In this case, the nozzle holder 51 can be moved in XYZ directions together with the plural nozzles 61 mounted thereto by an XYZ robot (not shown).

Figure 2A:
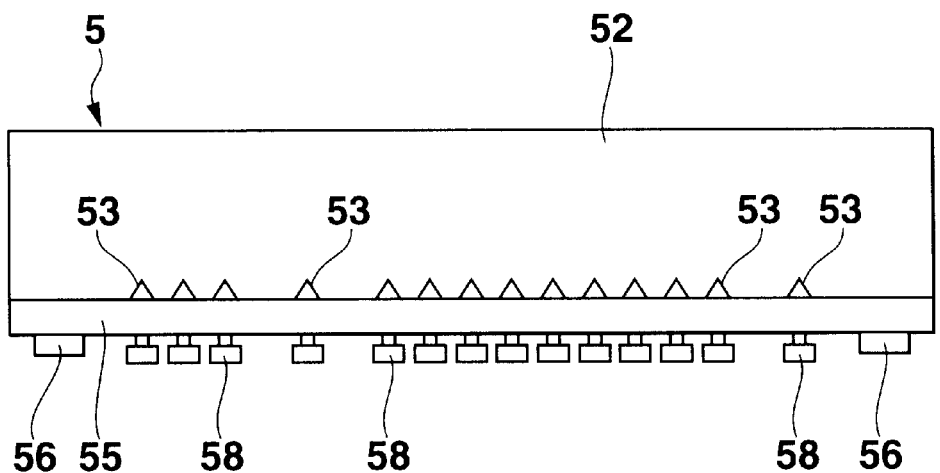
FIG. 2A is a plan view showing as an example the gist portion of the nozzle holder shown in FIG. 1.
Figure 2B:
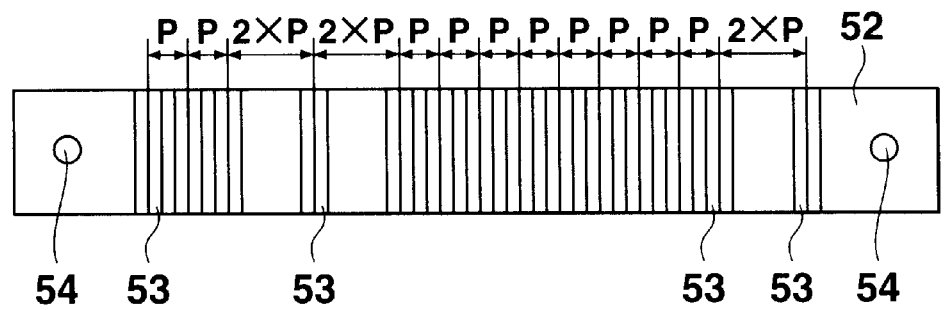
FIG. 2B is a plan view showing the main body of the nozzle holder shown in FIG. 2A as viewed from the front side.

FIG. 2A is a plan view showing as an example the gist portion of the nozzle holder 51, and FIG. 2B is a front view of the nozzle holder 52. A holder body 52 is in the shape of a band plate. Fourteen V-shaped grooves 53 are formed to extend in a vertical direction on the front surface excluding the both side portions in a longitudinal direction, and screw holes 54 are formed on the both side portions of the front side. The shapes, the positional relationship, etc. of the 14 V-shaped grooves 53 will be described herein later. A support plate 55 is mounted to the front surface of the holder body 52 by screws 56 engaged with the screw holes 54. Screw holes 57 (see FIG. 4) are formed in the portions corresponding to the V-shaped grooves 53 of the support plate 55. Cap screws 58 are inserted into these screw holes 57.

Figure 3:
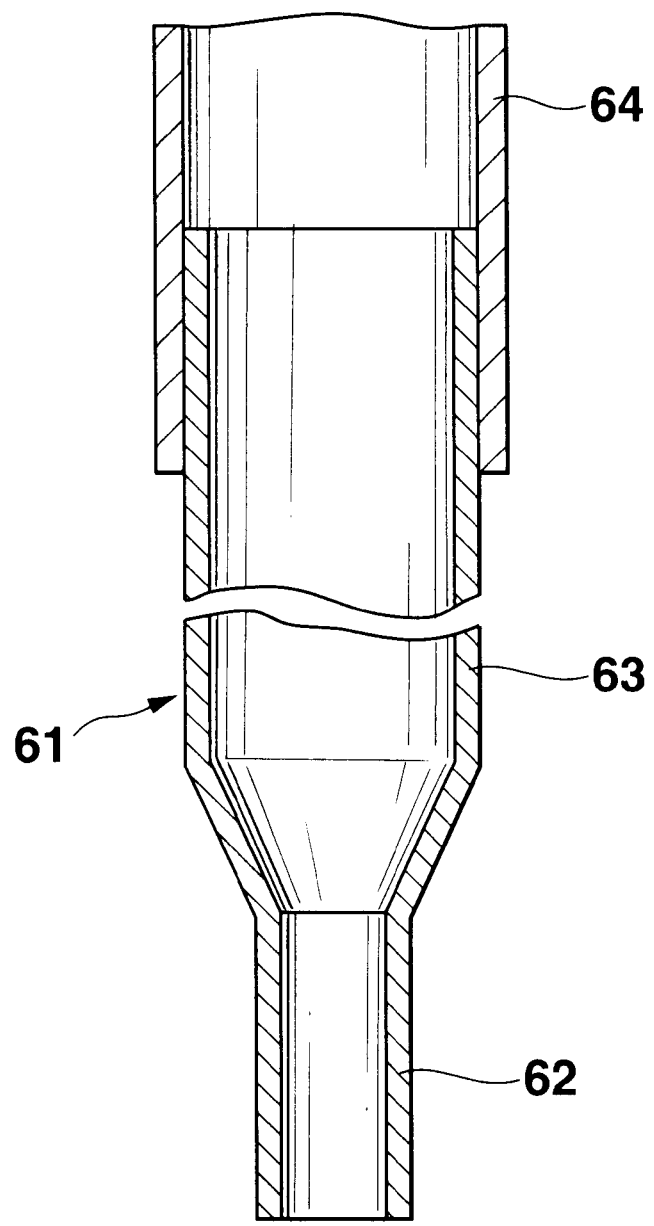
FIG. 3 is a cross sectional view showing in a magnified fashion the gist portion of the nozzle shown in FIG. 1.

FIG. 3 is a cross sectional view showing as an example the gist portion of the nozzle 61 for the discharge. The nozzle 61 comprises a tip nozzle portion 62 having a predetermined outer diameter and a nozzle body 63 having a predetermined large diameter and positioned in an upper portion of the tip nozzle portion 62. One end portion of a tube 64 is coupled into an upper portion of the nozzle body 63. The other end portion of the tube 64 is connected to a dispenser (not shown). It is possible to prepare, for example, three kinds of nozzles 61 differing from each other in the outer diameter of the tip nozzle portion 62, though the nozzle bodies 63 are the same in the outer diameter. It should be noted in this connection that, in this case, it is possible to select appropriately the nozzle 61 including the tip nozzle portion 62 having a suitable outer diameter in view of the viscosity of the resin used for the coating, the size of the resin film to be formed, etc. It should also be noted that, since the outer diameter of the nozzle body 63 is left unchanged, the center position of the nozzle tip portion 62 is not changed when the nozzle 61 is mounted to the nozzle holder 63 even if the outer diameter of the nozzle tip portion 62 is changed. It follows that the position of the nozzle body 63 need not be adjusted again and, thus, the nozzle 61 can be replaced efficiently.

Figure 4:
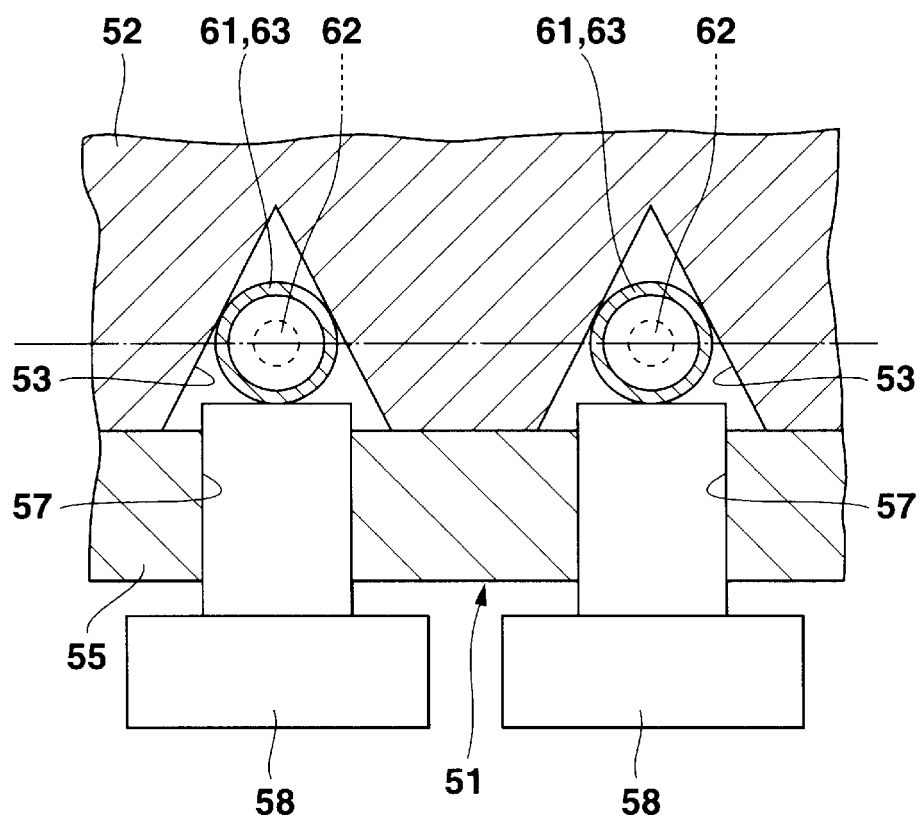
FIG. 4 is a cross sectional view showing in a magnified fashion the state that the nozzle shown in FIG. 3 is mounted to the nozzle holder shown in FIG. 2A.

FIG. 4 shows the state that the nozzle 61 is mounted to the nozzle holder 51. The nozzle body 63 of the nozzle 61 is arranged within the V-shaped groove 53 of the holder body 52. Since the cap screw 58 inserted into the screw hole 57 of the supporting plate 55 is screwed in, the nozzle body 63 is pressed against both side walls of the V-shaped groove 53 by the tip portion of the cap screw 58. In this case, since the nozzle body 63 of the nozzle 61 is arranged within the V-shaped groove 53, the nozzle 61 can be arranged at a predetermined position within the V-shaped groove 53 regardless of the outer diameter of the tip nozzle portion 62.

As a result, the center of the tip nozzle portion 62 of the nozzle 61 is kept arranged on a straight line denoted by a dot-and-dash line shown in FIG. 4 regardless of the outer diameter of the tip nozzle portion 62. It follows that, even if a plurality of nozzles 61 of the same kind are arranged within some of the 14 V-shaped groove 53 shown in FIG. 2A, the centers of the tip nozzle portions 62 of these nozzles 61 are kept arranged on the straight line denoted by the dot-and-dash line in FIG. 4. Incidentally, even if the centers of the tip nozzle portions 62 of a plurality of nozzles 61 are required to be arranged within 30 to 70 $\mu$m from the center position in the design, it is possible to fully satisfy the requirement. As a matter of fact, it is possible to arrange the centers of the tip nozzle portions within 10 $\mu$m from the center position in the design.

The 14 V-shaped grooves 53 of the nozzle holder 51 will now be described. The arranging pitch P of the 14 V-shaped grooves 53 is basically equal to the pitch P (ex. 4.75 mm) of the sprocket holes 21 of the base film 11 shown in FIG. 8. It should be noted, however, that any of the pitches (distances) between the first and second V-shaped grooves 53, between the tenth and eleventh V-shaped grooves 53, and between the eleventh and twelfth V-shaped grooves 53 as viewed from the right side is twice the pitch of the sprocket holes 21 of the base film 11, as apparent from FIGS. 2A and 2B.

FIG. 5 shows the number of nozzles 61 and the arranging positions of these nozzles 61 on the nozzle holder 51. In FIG. 5, the numerals 1 to 14 shown in the upper row in the column of "Arranging Position of Nozzles" denote the positions of the 14 V-shaped grooves 53 shown in FIG. 2A as counted from the right side. Also, the numerals 1 to 16 shown in the lower row in the column of "Arranging Position of Nozzles" denote the positions of the V-shaped grooves 53 with the V-shaped groove 53 positioned on the right-hand end in FIG. 2A used as basis. In the lower row noted above, the positions of the V-shaped grooves 53 are denoted in terms of the number of pitches as counted from the right-hand end V-shaped groove 53 used as the basis. To be more specific, any of the distances between the first and second V-shaped grooves 53, between the tenth and eleventh V-shaped grooves 53, and between the eleventh and twelfth grooves 53 is equal to two pitches (2P), with the result that the arranging positions of the nozzles are increased by 2P in each of these positions. Further, the numerals 2 to 10 shown in the column of "Length LD of Device Region" in FIG. 5 denote the length LD of the device region 22 shown in FIG. 8 in terms of the number of pitches of the sprocket holes 21.

Description will now be given to cover as representatives the cases where the lengths of the device regions 22 are equal to the 3 pitch length and to the 6 pitch length, respectively. Where the length of the device region 22 is equal to the 3 pitch length, the nozzle 61 is mounted to the arranging position corresponding to the case where the length LD of the device region is "3". To be more specific, the nozzles 61 are mounted to only the first, third, sixth, ninth, eleventh and thirteenth V-shaped grooves 53 as counted from the right-hand end V-shaped groove 53 of the nozzle holder 51. In other words, 6 nozzles 61 are arranged in total as shown by "6" in the Number of Arranged Nozzles column. The arranging pitch of the nozzles 61 in this case is 3P, which is three times as much as the pitch P of the sprocket holes 21. Where the length LD of the device region 22 is equal to the 6 pitch length, the nozzles 61 are mounted to the nozzle arranging positions corresponding to the case where the length LD of the device region corresponds to "6". To be more specific, the nozzles 61 are arranged in only the first, sixth and eleventh V-shaped grooves 53 as counted from the right-hand end V-shaped groove 53 of the nozzle holder 51. In other words, three nozzles 61 are mounted in total as shown by "3" in the Number of Arranged Nozzles column. The arranging pitch of the nozzles 61 in this case is 6P, which is six times as much as the pitch P of the sprocket holes 21.

Formation of a resin film will now be described, covering the case where the length LD of the device region is equal to the 6 pitch length. In this case, 3 nozzles 61 are arranged as shown in FIG. 5. Since the arranging pitch of these nozzles 61 is 6P, which is 6 times as much as the pitch P of the sprocket holes 21, the resin coating is applied to the semiconductor chips 27 in the 3 device regions 22 shown in FIG. 8 in a single resin coating step, and the base film 11 is transferred by 18 pitches (6×3). In this case, the single resin coating time is set at m seconds. Also, the time for the base film 11 to pass through the drying section is set at M minutes.

Figure 8:
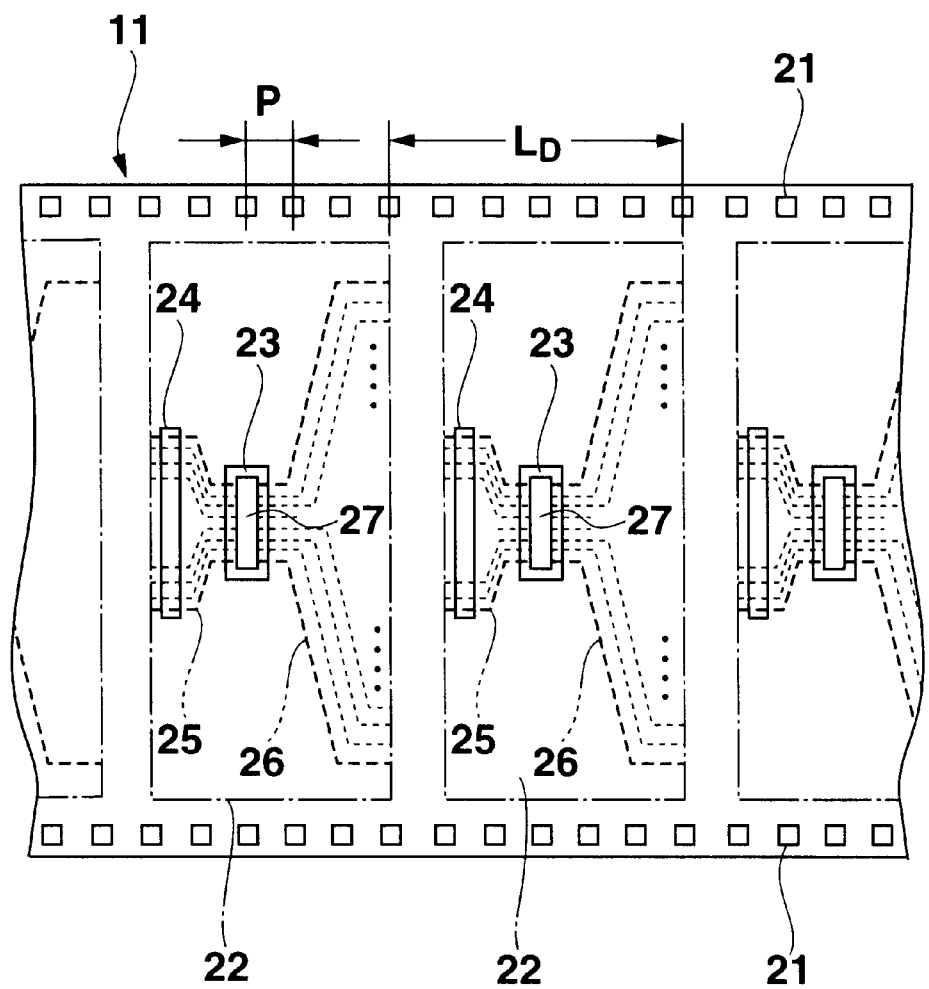
FIG. 8 is a plan view showing in a magnified fashion the film shown in FIG. 7.

Then, the resin film formation will now be described, covering the case where the length LD of the device region 22 is equal to the 3 pitch length. In this case, 6 nozzles 61 are arranged as shown in FIG. 5. Also, since the arranging pitch of these nozzles 61 is 3P, which is 3 times as much as the pitch P of the sprocket holes 21, the resin coating is applied to the semiconductor chips 27 within the 6 device regions 22 as shown in FIG. 8 in a single resin coating process, and the base film 11 is transferred by 18 pitches (3×6). What should be noted is that the transfer distance of the base film 11 in a single resin coating process, in which the single resin coating time is set at m seconds, is equal to the 18 pitch length as in the case where length LD of the device region 22 is equal to the 6 pitch length. It follows that the time for the base film 11 to pass through the drying section is also M minutes.

As described above, it is possible to set constant the transfer distance of the base film 11, which is to be transferred by a single resin coating process carried out by a plurality of nozzles 61, by changing the number of nozzles 61 and the arranging positions of the nozzles 61 in accordance with the length LD of the device region 22. As a result, it is also possible to set constant the time for the base film 11 to pass through the drying section. What should be noted is that the time for the base film 11 to pass through the drying section can be set constant even if the length LD of the device region 22 differs, leading to an improved productivity.

What should also be noted in conjunction with FIG. 5 is that, where the length LD of the device region 22 is equal to the 2 pitch length, 8 nozzles 61 are arranged. Since the pitch of the arrangement is 2P, which is twice the pitch P of the sprocket holes 21, the transfer distance of the base film 11 in a single resin coating process is 16 pitches (8×2). Therefore, in this case, the time for the base film 11 to pass through the drying section is M×18/16 minutes, which is substantially equal to the value in the case described above. Incidentally, if 9 nozzles 61 are arranged, it is possible to permit the transfer distance of the base film 11 in a single resin coating process to be equal to the 18 pitch length (9×2).

Where the length LD of the device region 22 is equal to the 7 pitch length, 3 nozzles 61 are arranged, as shown in FIG. 5. Since the arranging pitch of these nozzles 61 is 7P, which is seven times as much as that of the sprocket holes 21, the transfer distance of the base film 11 in a single resin coating process is equal to 21 pitch length (3×7). It follows that, in this case, the time for the base film 11 to pass through the drying section is slightly longer than M×18/21 included with a base film transfer time, which is substantially equal to that described previously. Incidentally, in this case, if the drying time of at least M minutes is required, it is possible to set the time for the base film 11 to pass through the drying section at M minutes or more in view of a suitable waiting time in a single resin coating process. Alternatively, it is also possible to arrange two nozzles 61.

Further, as shown in FIG. 5, where the length LD of the device region 22 is equal to the 8 pitch length, two nozzles 61 are arranged. Since the arranging pitch of these nozzles 61 is 8P, which is 8 times as much as that of the sprocket holes 21, the transfer distance of the base film 11 in a single resin coating process is equal to 16 pitch length (2×8), which is equal to the value in the case where the length LD of the device region 22 is equal to the 2 pitch length. It should be noted that, if 3 nozzles 61 are arranged, the transfer distance of the base film 11 in a single resin coating process is equal to the 24 pitch length (3×8). In this case, however, if the base film 11 is transferred (m+α) seconds after initiation of the resin coating operation in view of a suitable waiting time of α seconds in a single resin coating process, it is possible to set the time for the base film 11 to pass through the drying section at M minutes or more so as to ensure a sufficient drying time.

Incidentally, it is possible to form the V-shaped grooves 53, which are formed in the nozzle holder 51, in the positions of the numerals "1", "11" and "13" included in the numerals 0 to 16 in the lower row in the column of "Arranging Positions of Nozzles" in FIG. 5. Also, in the embodiment described above, the nozzles 61 are mounted to the nozzle holder 51 by the cap screws 58 inserted into the screw holes of the supporting member 55. However, the present invention is not limited to the particular construction. For example, it is also possible to use an elastic member such as a leaf spring or a coil spring in place of the cap screw 58. Alternatively, it is possible to use an elastic member for forming the supporting member 55 itself. Further, supporting member 55 is mounted to the nozzle holder 52 by using the mounting screw 56. Of course, the present invention is not limited to the particular construction, and the mounting structure can be modified appropriately. For example, it is possible for each of these nozzle holder 52 and supporting member 55 to be held by a U-shaped elastic member. Alternatively, it is possible to join detachably a gripper equipped with rollers to a ring mounted in one of these members.

It should be noted in conjunction with FIG. 8 that it is possible for the semiconductor chip 27 not to be mounted in any of the device holes 23. In such a case, the particular device hole 23 literally constitutes an open portion, with the result that, if the open portion is coated with resin, the resin is wasted and the surrounding region is stained.

Such being the situation, the description will now cover the case where the semiconductor chip 27 is not mounted in any of the device holes 23. First of all, sensors for detecting the states the resin film forming regions of the base film 11 are arranged in the front stage of the arranging positions of the plural nozzles 61. For example, a plurality of sensors for detecting whether or not the semiconductor chip 27 is mounted within the device hole 23 of the base film 11 are arranged in the longitudinal direction of the base film 11. Where the length LD of the device region 22 is equal to the 2 to 10 pitch length as shown in FIG. 5, arranged are 14 sensors. The arranging positions of these 14 sensors are equal to the arranging positions of the nozzles 61 denoted by the numerals 1 to 14 in FIG. 5.

Where, for example, the length LD of the device region 22 is equal to the 6 pitch length, it is detected whether or not the semiconductor chip 27 is mounted within the device hole 23 of the base film 11 by the sensor corresponding to the arranging position of the nozzle 61 in the case where the length of the device region 22 is equal to the 6 pitch length in FIG. 5. Based on the result of the detection, resin layers are formed by the three nozzles 61 in only the portions where the semiconductor chips 27 are mounted, and the resin layer is not formed in the portion where the semiconductor chip 27 is not formed. As a result, the resin can be saved, and it is possible to prevent the surrounding region from being stained.

The embodiment described above covers the so-called TAB system in which the semiconductor chip 27 is mounted within the device hole 23 of the base film 11. However, the present invention can be modified in various fashions within the technical scope of the present invention. For example, the resin film forming method of the present invention can also be applied to a so-called COF (Chip On Film) system, in which an electronic part mounted directly on a film is coated with resin.

As described above, according to the present invention, the transfer distance of the base film transferred in a single resin coating step performed by using a plurality of nozzles is rendered substantially constant by changing the number of nozzles and the arranging positions of the nozzles. As a result, the time for the base film to pass through the drying section can be maintained substantially constant. It follows that, even if the interval for forming the resin films, e.g., the length LD of the device region, differs, it is possible to maintain substantially constant the time for the base film to pass through the drying section, leading to an improved productivity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resin film forming method comprising:
   transferring a long film including a plurality of resin film forming regions each having a length LD;
   simultaneously forming resin films in k-number of resin film forming regions arranged on one surface of the film by using k-number of nozzles arranged at an interval on a path through which said film is transferred; and
   transferring the film by a distance for a drying treatment;
   wherein the number k of nozzles is changed to permit a drying time to fall within a period in accordance with the length LD of the each of the resin film forming regions arranged on said one surface of the film.

2. The resin film forming method according to claim 1, wherein an amount of transfer of said film after forming said resin films is kLD.

3. The resin film forming method according to claim 1, wherein said film is provided with sprocket holes arranged at a pitch P, and the length LD of each of said resin film forming regions is n times the pitch of said sprocket holes, where n is an integer.

4. The resin film forming method according to claim 3, wherein an amount of transfer of said film after forming said resin films is knP.

5. The resin film forming method according to claim 1, wherein said k-number of nozzles are mounted to a nozzle holder included in a resin film forming apparatus.

6. The resin film forming method according to claim 1, wherein forming of said resin films is carried out while the transfer of said film is stopped.

7. The resin film forming method according to claim 6, wherein the transfer of the film is stopped for a time after formation of the resin films on said film.

8. The resin film forming method according to claim 1, wherein a semiconductor chip is mounted in each resin film forming region of said film, and said resin films are formed on at least a part of said mounted semiconductor chips.

9. The resin film forming method according to claim 8, wherein a device hole is formed in each resin film forming region of the film, and the semiconductor chips are bonded to a wiring formed within said device holes in a projecting fashion.

10. The resin film forming method according to claim 1, wherein a state of the resin film forming regions is detected by a sensor, and a decision is made as to whether or not the resin films should be formed in said resin film forming regions based on a detection result of said sensor.

11. A resin film forming method comprising:
    preparing a long first film including a plurality of resin film forming regions each having a length LD;
    mounting said first film to a transfer device capable of transferring said first film;
    transferring said first film by said transfer device to a resin film forming apparatus having q-number of nozzle mounting sections arranged on a film transfer path and having a k-number of nozzles mounted to said nozzle mounting sections, and stopping the transfer of said first film at positions corresponding said k-number of nozzles;
    simultaneously forming resin films in said resin film forming regions by using said k-number of nozzles mounted to said resin film forming apparatus;
    transferring the first film having said resin films formed thereon by kLD;
    providing a long second film including a plurality of resin film forming regions each having a length mLD;
    mounting k/m-number of nozzles to said nozzle mounting sections;
    transferring said second film by said transfer device to said resin film forming apparatus, and stopping the transfer of said second film at positions corresponding said k/m-number of nozzles;
    simultaneously forming resin films in said resin film forming regions by using said k/m-number of nozzles mounted to said resin film forming apparatus; and
    transferring the second film having said resin films formed thereon by kLD.

12. The resin film forming method according to claim 11, wherein said k-number of nozzles and said k/m-number of nozzles mounted to said nozzle mounting sections are arranged at positions of arithmetic progression.

* * * * *